US009137595B2

(12) United States Patent
Lee

(10) Patent No.: US 9,137,595 B2
(45) Date of Patent: Sep. 15, 2015

(54) APPARATUS FOR PREVENTION OF PRESSURE TRANSIENTS IN MICROPHONES

(71) Applicant: Knowles Electronics, LLC, Itasca, IL (US)

(72) Inventor: Sung Bok Lee, Chicago, IL (US)

(73) Assignee: KNOWLES ELECTRONICS, LLC, Itasca, IL (US)

( * ) Notice: Subject to any disclaimer, the term of this patent is extended or adjusted under 35 U.S.C. 154(b) by 0 days.

(21) Appl. No.: 14/075,818

(22) Filed: Nov. 8, 2013

(65) Prior Publication Data

US 2014/0133687 A1 May 15, 2014

Related U.S. Application Data

(60) Provisional application No. 61/726,256, filed on Nov. 14, 2012.

(51) Int. Cl.

*H04R 19/04* (2006.01)
*H04R 1/08* (2006.01)
*H01L 29/84* (2006.01)
*G01L 9/00* (2006.01)

(52) U.S. Cl.

CPC .......... *H04R 1/083* (2013.01); *H04R 2201/003* (2013.01)

(58) Field of Classification Search

CPC .................................. H04R 1/086; H04R 1/28
USPC .......... 381/355, 345; 257/245, 252, 254, 416, 257/419
See application file for complete search history.

(56) References Cited

U.S. PATENT DOCUMENTS

2003/0179894 A1* 9/2003 Saltykov ........................ 381/313
2011/0110550 A1* 5/2011 Bharatan et al. .............. 381/355
2011/0272769 A1 11/2011 Song et al.

FOREIGN PATENT DOCUMENTS

JP 2010021225 A 1/2010
KR 1020060099627 A 9/2006
KR 1020090097446 A 9/2009

OTHER PUBLICATIONS

International Search Report and Written Opinion for PCT/US2013/069602, dated Feb. 20, 2014, 9 pages.

* cited by examiner

*Primary Examiner* — Curtis Kuntz
*Assistant Examiner* — Norman Yu
(74) *Attorney, Agent, or Firm* — Fitch, Even, Tabin & Flannery LLP

(57) ABSTRACT

An acoustic device includes a substrate, a microelectromechanical system (MEMS) apparatus, a cover, a port, and a valve. The MEMS apparatus includes a diaphragm and a back plate. The cover is coupled to the substrate and encloses the MEMS apparatus. The port is disposed through the substrate and the MEMS apparatus is disposed over the port. The valve is disposed over the port and opposite the MEMS apparatus. The valve is configured to assume a closed position during the occurrence of a high pressure event and prevent a pressure transient from damaging the MEMS apparatus. The valve is configured to assume an open position during the absence of a high pressure event.

6 Claims, 5 Drawing Sheets

502
504
506
510
512
514

APPARATUS FOR PREVENTION OF PRESSURE TRANSIENTS IN MICROPHONES

CROSS REFERENCE TO RELATED APPLICATION

This patent claims benefit under 35 U.S.C. §119 (e) to U.S. Provisional application No. 61/726,256, filed Nov. 14, 2012 and entitled "Apparatus for Prevention of Pressure Transients in Microphones," the content of which are incorporated herein by reference in their entirety.

TECHNICAL FIELD

This application relates to acoustic devices, and more specifically to preventing damage to these devices.

BACKGROUND OF THE INVENTION

MicroElectroMechanical System (MEMS) devices include microphones and speakers to mention two examples. In the case of a MEMS microphone, sound energy enters through a sound port and vibrates a diaphragm and this action creates a corresponding change in electrical potential (voltage) between the diaphragm and a back plate disposed near the diaphragm. This voltage represents the sound energy that has been received. Typically, the voltage is then transmitted to an electric circuit (e.g., an integrated circuit such as an application specific integrated circuit (ASIC)). Further processing of the signal may be performed on the electrical circuit. For instance, amplification or filtering functions may be performed on the voltage signal at the integrated circuit. The components of the microphone are typically disposed on a printed circuit board (PCB), substrate, or base, which also may provide electrical connections between the microphone components as well as providing a physical support for these components.

Microphones are sometimes subject to high pressure events. For example, the device in which the microphone is disposed may be dropped or struck. This may create a high energy pressure that enters the microphone and damages the components. For various reasons, current approaches have not proved adequate in protecting these devices from such events.

BRIEF DESCRIPTION OF THE DRAWINGS

For a more complete understanding of the disclosure, reference should be made to the following detailed description and accompanying drawings wherein.

Skilled artisans will appreciate that elements in the figures are illustrated for simplicity and clarity. It will further be appreciated that certain actions and/or steps may be described or depicted in a particular order of occurrence while those skilled in the art will understand that such specificity with respect to sequence is not actually required. It will also be understood that the terms and expressions used herein have the ordinary meaning as is accorded to such terms and expressions with respect to their corresponding respective areas of inquiry and study except where specific meanings have otherwise been set forth herein.

DETAILED DESCRIPTION

Approaches are provided that protect the internal components of microphones from pressure transcient events. In these approaches, the air flow allowed into the microphone is significantly limited or eliminated altogether when extreme pressure events occur.

In many of these embodiments, an acoustic device includes a substrate, a microelectromechanical system (MEMS) apparatus, a cover, a port, and a valve. The MEMS apparatus includes a diaphragm and a back plate. The cover is coupled to the substrate and encloses the MEMS apparatus. The port is disposed through the substrate and the MEMS apparatus is disposed over the port. The valve is disposed over the port and opposite the MEMS apparatus. The valve is configured to assume a closed position during the occurrence of a high pressure event and prevent a pressure transient from damaging the MEMS apparatus. The valve is configured to assume an open position during the absence of a high pressure event.

In one aspect, the valve includes a plurality of springs coupled to a central member. In other aspects, during the high pressure event, a portion of the valve covers the port. In another aspect, the valve is disposed at least partially on an exterior of the substrate. In yet another aspect, an ASIC is disposed on the substrate.

Figure 2:
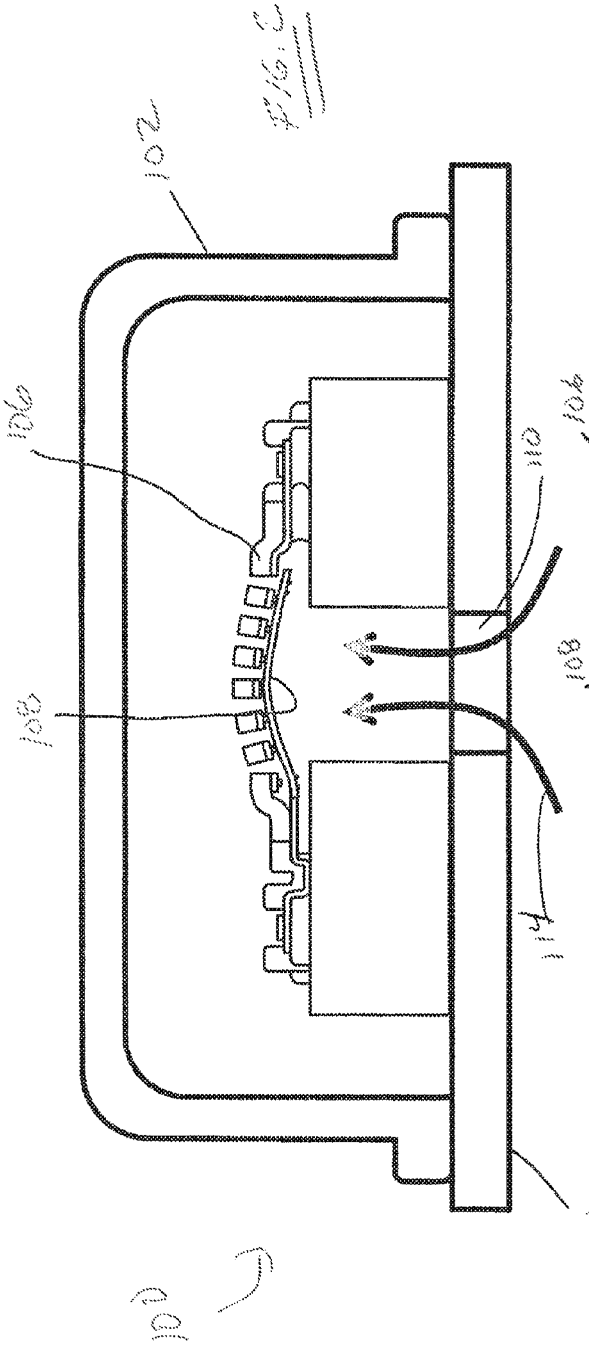
FIG. 2 comprises a side cutaway view of the microphone apparatus of FIG. 1 without a valve apparatus according to various embodiments of the present invention.
Figure 1:
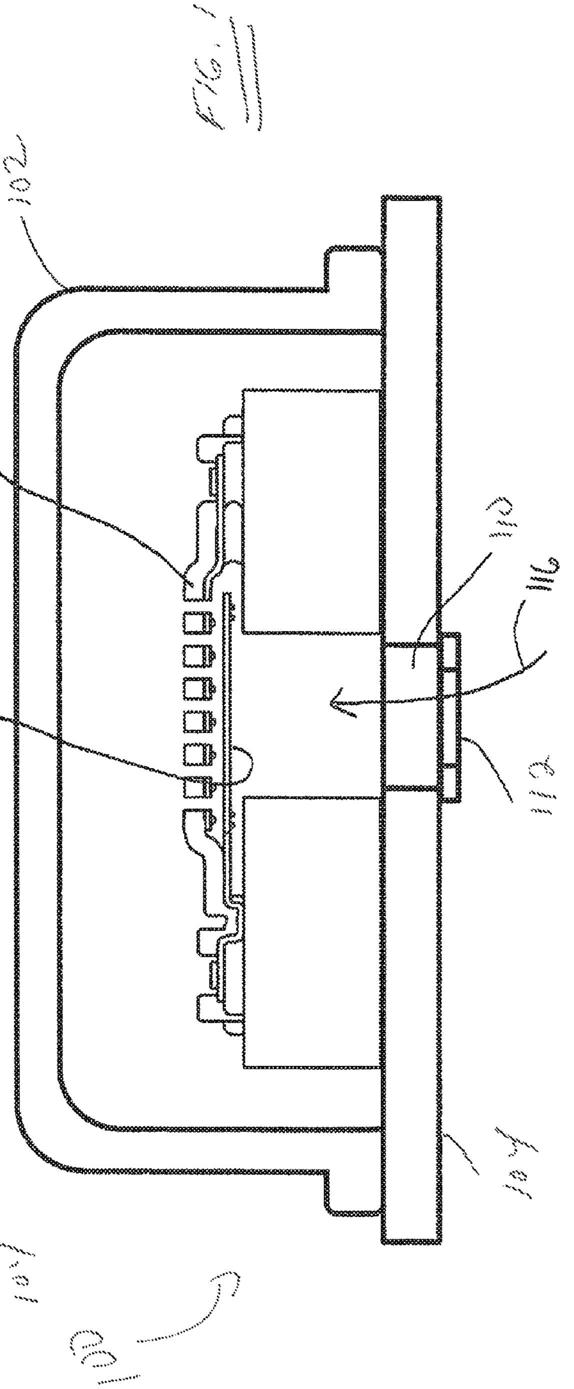
FIG. 1 comprises a side cutaway view of a microphone apparatus according to various embodiments of the present invention.

Referring now to FIGS. 1 and 2, a MEMS microphone device is shown. The microphone includes a cover 102, base 104, back plate 106, diaphragm 108. A port 110 extends through the base 104. A valve 112 is placed over the port 110. The valve 112 actuates or closes when there is a large pressure event. Without actuation or closing of the valve, the components will react as shown in FIG. 2 as a high pressure or excessive air flow 114 enters through the port 110.

In operation, normal sound energy 116 enters through a sound port and vibrates a diaphragm 108. This action creates a corresponding change in electrical potential (voltage)

between the diaphragm 108 and the back plate 106. This voltage represents the sound energy that has been received. In some aspects, the voltage is then transmitted to an electric circuit (e.g., an integrated circuit such as an application specific integrated circuit (ASIC) and not shown in FIG. 1 or 2). Further processing of the signal may be performed on the electrical circuit. For instance, amplification or filtering functions may be performed on the voltage signal at the integrated circuit.

The valve 112 is configured to prevent the entry of the high pressure or excessive air flow 114 into the port 110 and thereby into the microphone 100. More specifically, upon the existence of a high pressure air flow 114, the valve automatically closes thereby preventing the high pressure air flow 114 from entering the microphone 100 through the port 110. Air flows that are not high pressure events 116 (e.g., events where the pressure is below a predetermined threshold) are allowed to enter the microphone 100 through the port 110. This occurs because the valve does not automatically close during this normal type of air flow. By "automatically," it is meant without human intervention in that the structure of the valve reacts to the high pressure event and closes.

Figure 4:
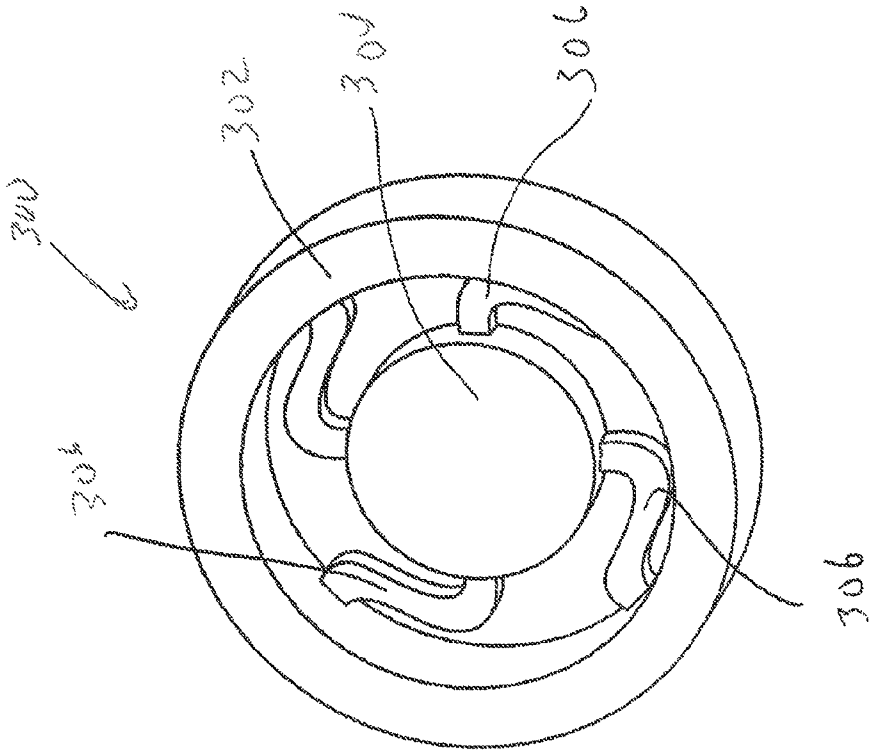
FIG. 4 comprises a perspective view of a valve apparatus according to various embodiments of the present invention.
Figure 3:
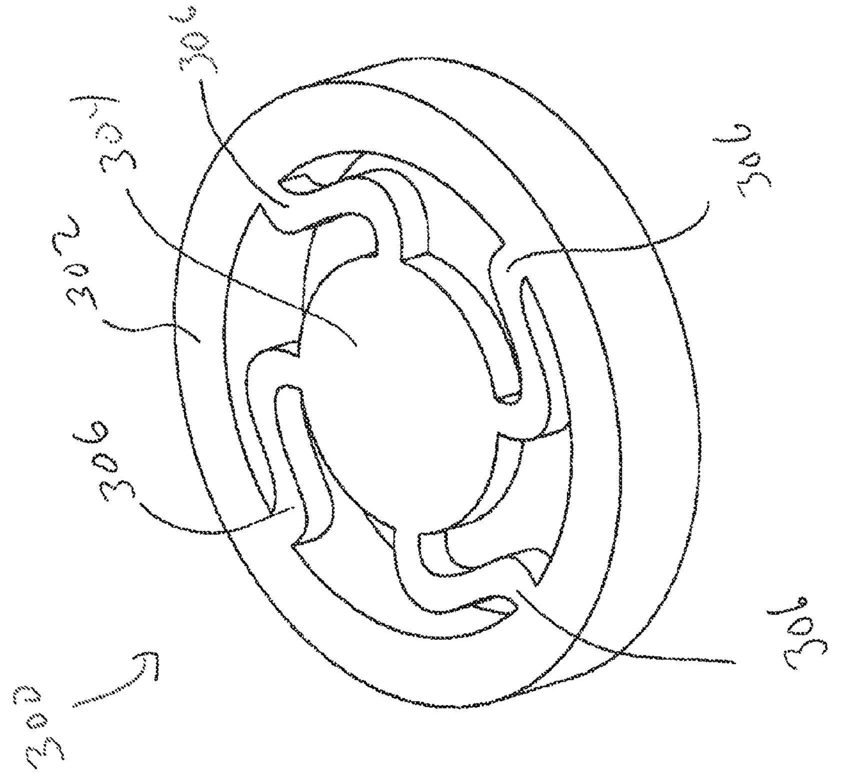
FIG. 3 comprises a perspective view of a valve apparatus according to various embodiments of the present invention.
Figures 5, 6, 7, 8:
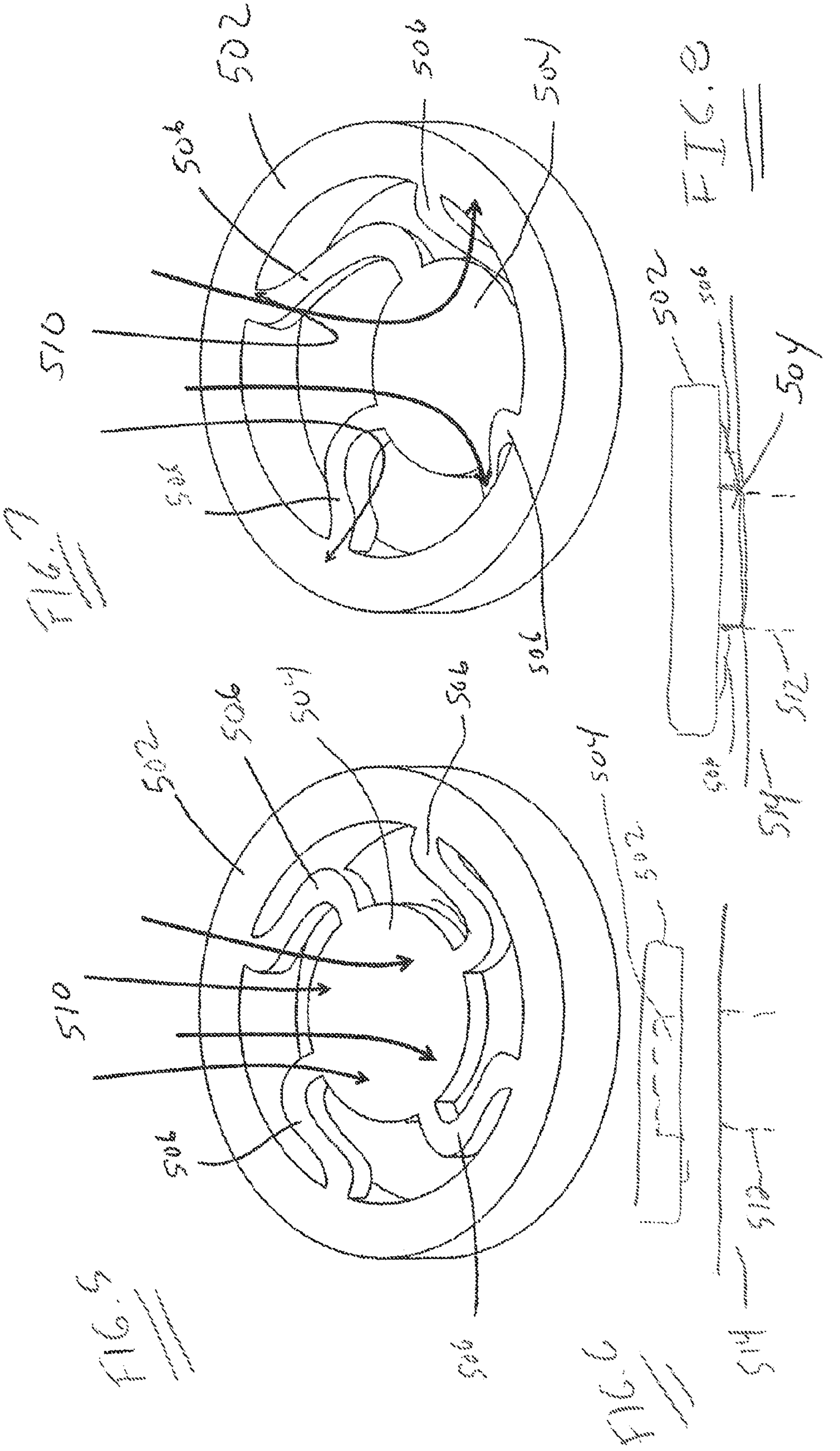
FIG. 5 comprises a perspective view of a valve apparatus as pressure is beginning to be applied to the valve apparatus according to various embodiments of the present invention.
FIG. 6 shows a cross sectional view of the apparatus of FIG. 5 according to various embodiments of the present invention.
FIG. 7 comprises a perspective view of a valve apparatus as pressure is applied and the valve apparatus is closed according to various embodiments of the present invention.
FIG. 8 shows a cross sectional view of the apparatus of FIG. 7 according to various embodiments of the present invention.

Referring now to FIGS. 3 and 4, one example of a valve is described. The valve includes an outer ring 302, a cover 304 and springs 306. The outer ring 302, cover 304 and springs 306 are constructed from epoxy in one example. In other examples, rubber may be used. Other examples or configurations are possible. As explained elsewhere herein, under high pressure (e.g., when the pressure exceeds a predetermined threshold), the springs 306 bend and move the cover 304 downward. The valve 300 is positioned over the associated port (i.e., the microphone port 110 or any other port through which air must travel to reach the microphone). When the cover moves downward it covers or otherwise closes the port. Since the port is covered or closed, high pressure sound energy cannot enter the port and damage the internal components of the microphone. The exact configuration, shape, and dimensions of the outer ring 302, cover 304, or springs 306 may vary due to the needs of the user or the system. The valve may be a separate device that is attached to a port or may be fabricated as part of the port.

Referring now to FIGS. 5, 6, 7, and 8 one example of a valve activation is described. The valve includes an outer ring 502, a cover 504 and springs 506. The outer ring 502, cover 504 and springs 506 are constructed from epoxy in one example. Other examples or configurations are possible. Under high pressure 510 (e.g., when the pressure exceeds a predetermined threshold), the springs 506 bend and move the cover 504 downward. The valve 500 is positioned over a port 512 of a microphone 514. When the cover 504 moves downward it covers or otherwise closes the port 512. Since the port 512 is covered or closed, the high pressure sound energy 510 cannot enter the port 512 and damage the internal components of the microphone 514.

Figure 10:
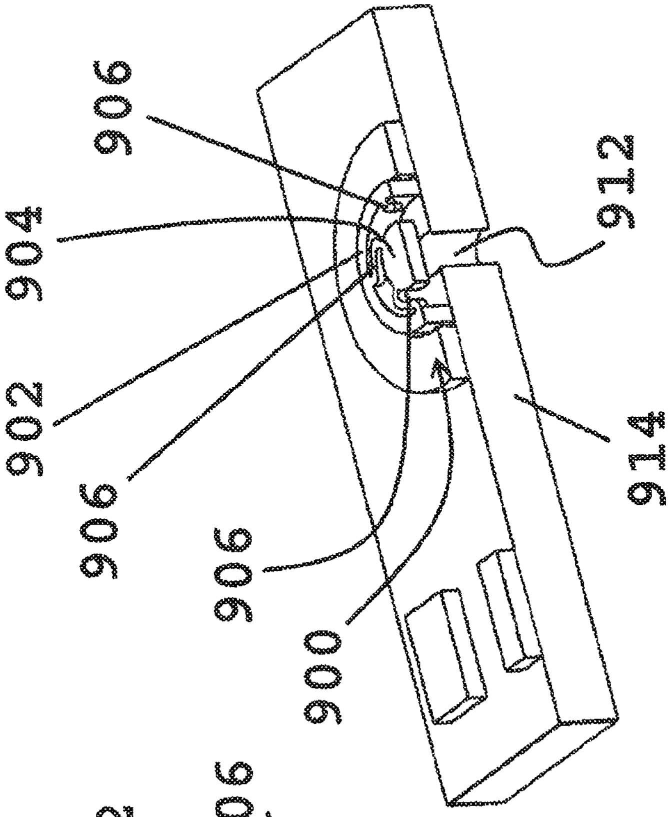
FIG. 10 comprises a perspective cutaway view of the apparatus of FIG. 9 according to various embodiments of the present invention.
Figure 9:
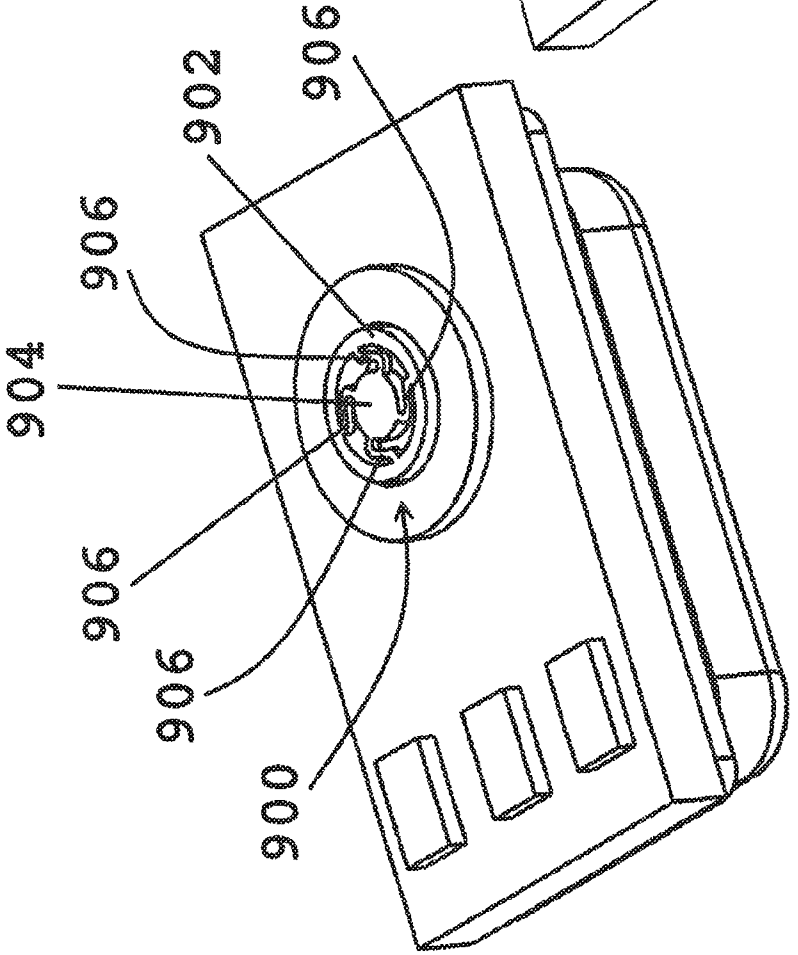
FIG. 9 comprises a perspective view of a valve apparatus applied to the substrate or the case of a microphone apparatus and is attached according to various embodiments of the present invention.

Referring now to FIG. 9 and FIG. 10, one example of a valve on a microphone housing is described. The valve 900 includes an outer ring 902, a cover 904 and springs 906. The outer ring 902, cover 904 and springs 906 are constructed from epoxy in one example. Other examples or configurations are possible. Under high pressure (e.g., when the pressure exceeds a predetermined threshold), the springs 906 bend and move the cover 904 downward. The valve 900 is positioned over a port 912 of a microphone 914. When the cover 904 moves downward it covers or otherwise closes the port 912. Since the port 912 is covered or closed, the high pressure sound energy cannot enter the port 912 and damage the internal components of the microphone 914.

Figure 12:
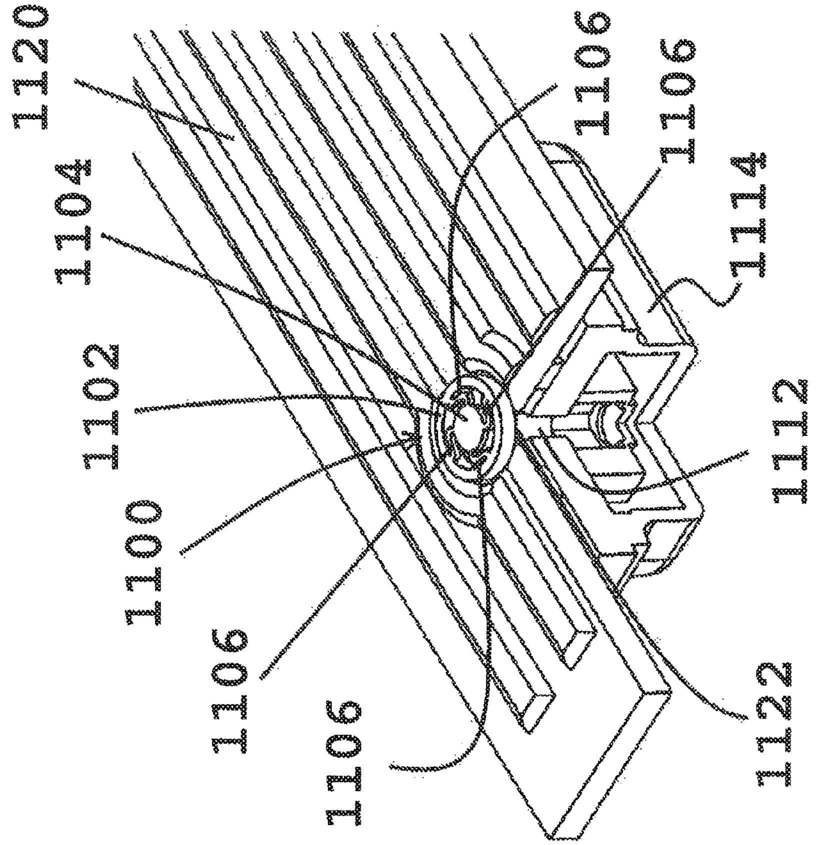
FIG. 12 comprises a perspective cutaway view of the apparatus of FIG. 11 according to various embodiments of the present invention.
Figure 11:
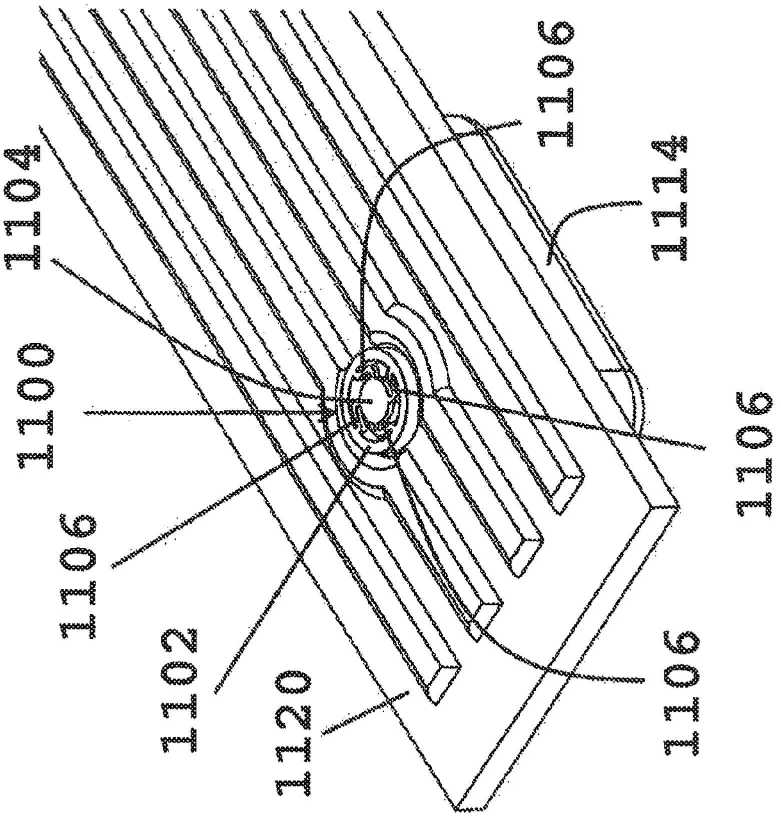
FIG. 11 comprises a perspective drawing of a valve apparatus applied to a flex circuit that is itself attached to a microphone according to various aspects of the present invention.

Referring now to FIG. 11 and FIG. 12, one example of attaching the valve to another device or structure where the structure is attached to a microphone is described. In this example, the valve includes an outer ring 1102, a cover 1104 and springs 1106. The outer ring 1102, cover 1104, and springs 1106 are constructed from epoxy in one example. Other examples or configurations are possible. The valve is attached to a flex circuit 1120. The flex circuit is attached to a microphone 1114. A first port 1112 in the microphone 1114 communicates with a second port 1122 through the flex circuit 1120.

Under high pressure (e.g., when the pressure exceeds a predetermined threshold), the springs 1106 bend and move the cover 1104 downward. The valve 1100 is positioned over the port 1122 (which communicates with port 1112). When the cover 1104 moves downward it covers or otherwise closes the port 1122 (and hence port 1112). Since the port 1122 is covered or closed, the high pressure sound energy cannot enter the port 1122 or 1112 and damage the internal components of the microphone 1114.

Preferred embodiments of this invention are described herein, including the best mode known to the inventors for carrying out the invention. It should be understood that the illustrated embodiments are exemplary only, and should not be taken as limiting the scope of the invention.

What is claimed is:

1. An acoustic device comprising:

a substrate;

a microelectromechanical system (MEMS) apparatus, the MEMS apparatus including a diaphragm and a back-plate;

a cover, the cover coupled to the substrate and enclosing the MEMS apparatus;

a port, the port disposed through the substrate, the MEMS apparatus being disposed over the port;

a valve, the valve disposed over the port and opposite the MEMS apparatus, the valve being configured to automatically without human intervention assume a closed position during the occurrence of a high pressure event and prevent a pressure transient from damaging the MEMS apparatus, the valve being configured to automatically without human intervention assume an open position during the absence of a high pressure event.

2. The acoustic device of claim 1 wherein the valve comprises a plurality of springs coupled to a central member.

3. The acoustic device of claim 1 wherein during the high pressure event a portion of the valve covers the port.

4. The acoustic device of claim 1 further comprising an application specific integrated circuit coupled to the substrate.

5. The acoustic device of claim 1 wherein the valve is disposed at least partially on an exterior of the substrate.

6. The acoustic device of claim 1 wherein in the valve is disposed on a structure with an opening and wherein the MEMS apparatus is connected to one side of the opening and the valve on the other side of the opening.

* * * * *